United States Patent [19]

Schouhamer Immink

[11] Patent Number: 4,802,190
[45] Date of Patent: Jan. 31, 1989

[54] METHOD OF TRANSMITTING INFORMATION BY MEANS OF CODE SIGNALS, INFORMATION TRANSMISSION SYSTEM FOR CARRYING OUT THE METHOD, AND TRANSMITTING AND RECEIVING APPARATUS FOR USE IN THE TRANSMISSION SYSTEM

[75] Inventor: Kornelis A. Schouhamer Immink, Eindhoven, Netherlands

[73] Assignee: U.S. Philips Corporation, New York, N.Y.

[21] Appl. No.: 45,921

[22] Filed: Jun. 15, 1987

[30] Foreign Application Priority Data

Jan. 26, 1987 [NL] Netherlands .................. 8700175

[51] Int. Cl.[4] .............................................. H04L 27/10
[52] U.S. Cl. .................................... 375/38; 370/118; 375/48; 375/122
[58] Field of Search .................... 375/38, 48, 122; 381/31; 370/22, 118; 382/43, 56

[56] References Cited

U.S. PATENT DOCUMENTS

| | | | |
|---|---|---|---|
| 4,001,564 | 1/1977 | Bied-Charreton | 370/22 |
| 4,011,511 | 3/1977 | Chang | 375/48 |
| 4,601,045 | 7/1986 | Lubarsky | 375/48 |

FOREIGN PATENT DOCUMENTS 2083322 3/1982 United Kingdom .

OTHER PUBLICATIONS

J. A. Gordon and R. Barrett, "Correlation-Recovered Adaptive Majority Multiplexing", Proc. IEE, vol. 118, No. 3/4, (1971), pp. 417–422.

*Primary Examiner*—Benedict V. Safourek
*Attorney, Agent, or Firm*—Thomas A. Briody; Jack E. Haken; Anne E. Barschall

[57] ABSTRACT

Method of transmitting information by means of code signals, information transmission systems for carrying out the method, and transmitting and receiving apparatus for use in the information transmission system.

A method of and system for transmitting n-bit information words is revealed, using code signals (Sc, $x_i$) in which the bits ($b_1$, $b_2$, $b_3$, $b_4$) having corresponding bit positions in different information words are always represented by frequency components (fd1, fd2, fd3, fd4; fh1, fh2, fh3, fh4) in the same frequency range of the frequency spectra of the code signals (Sc, $x_i$). Bits having different bit positions are represented by frequency components which are situated in different frequency ranges of the frequency spectra of the code signals. After transmission of the code signals the individual bits of the information words are recovered by means of frequency-domain detection.

14 Claims, 9 Drawing Sheets

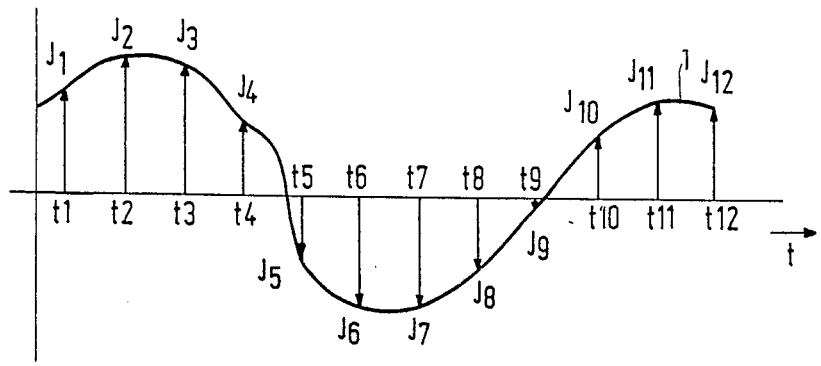
FIG.1
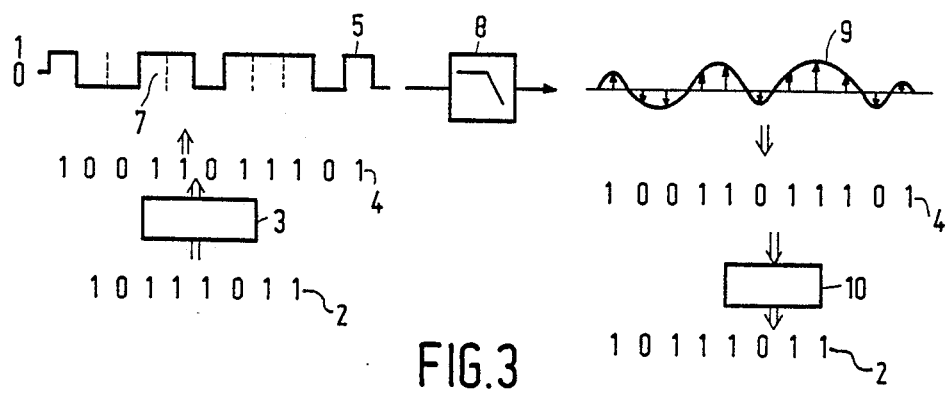
FIG.2
FIG.3

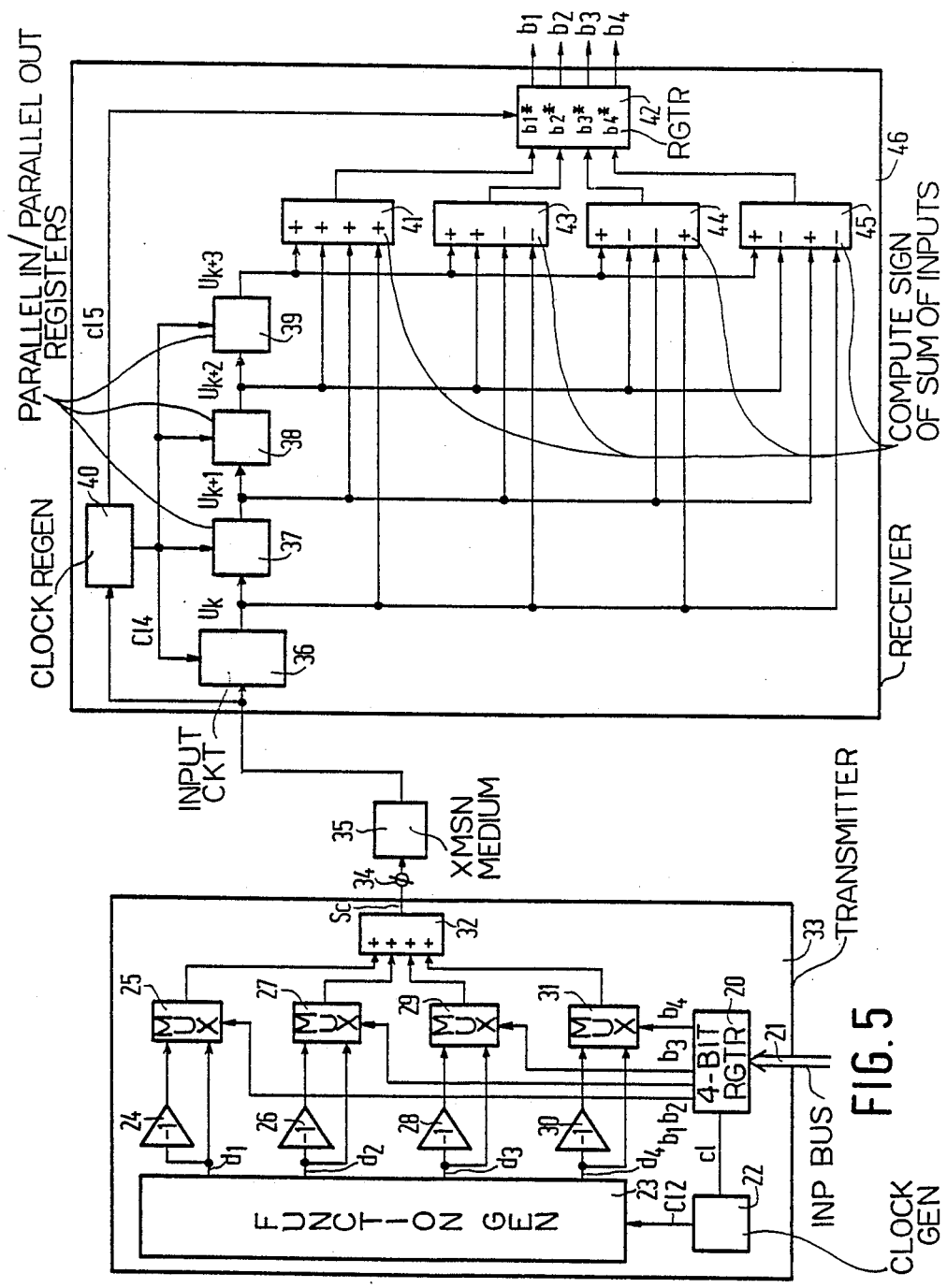

|  | C1 | C2 | C3 | C4 |
|---|---|---|---|---|
| $X_1(t)$ | −4 | 0 | 0 | 0 |
| $X_2(t)$ | −2 | −2 | +2 | −2 |
| $X_3(t)$ | −2 | −2 | −2 | +2 |
| $X_4(t)$ | 0 | −4 | 0 | 0 |
| $X_5(t)$ | −2 | 2 | −2 | −2 |
| $X_6(t)$ | 0 | 0 | 0 | −4 |
| $X_7(t)$ | 0 | 0 | −4 | 0 |
| $X_8(t)$ | +2 | −2 | −2 | −2 |
| $X_9(t)$ | −2 | +2 | +2 | +2 |
| $X_{10}(t)$ | 0 | 0 | 4 | 0 |
| $X_{11}(t)$ | 0 | 0 | 0 | 4 |
| $X_{12}(t)$ | +2 | −2 | +2 | +2 |
| $X_{13}(t)$ | 0 | 4 | 0 | 0 |
| $X_{14}(t)$ | +2 | +2 | +2 | −2 |
| $X_{15}(t)$ | +2 | +2 | −2 | +2 |
| $X_{16}(t)$ | 4 | 0 | 0 | 0 |

FIG. 7

|   | S |   |   |   |   |   |
|---|---|---|---|---|---|---|
| b₁ | b₂ | b₃ | Xi | C₂ | C₃ | C₄ |
| 0 | 0 | 0 | $X_8(t)$ | −2 | −2 | −2 |
| 0 | 0 | 1 | $X_3(t)$ | −2 | −2 | +2 |
| 0 | 1 | 0 | $X_2(t)$ | −2 | +2 | −2 |
| 0 | 1 | 1 | $X_{12}(t)$ | −2 | +2 | +2 |
| 1 | 0 | 0 | $X_5(t)$ | −2 | +2 | +2 |
| 1 | 0 | 1 | $X_{15}(t)$ | +2 | −2 | 2 |
| 1 | 1 | 0 | $X_{14}(t)$ | +2 | +2 | −2 |
| 1 | 1 | 1 | $X_9(t)$ | +2 | +2 | +2 |

FIG. 8a

|   | S |   |   |   |   |   |
|---|---|---|---|---|---|---|
| b₁ | b₂ | b₃ | Xi | C₁ | C₂ | C₃ |
| 0 | 0 | 0 | $X_3(t)$ | −2 | −2 | −2 |
| 0 | 0 | 1 | $X_2(t)$ | −2 | −2 | 2 |
| 0 | 1 | 0 | $X_5(t)$ | −2 | 2 | −2 |
| 0 | 1 | 1 | $X_9(t)$ | −2 | 2 | 2 |
| 1 | 0 | 0 | $X_8(t)$ | 2 | −2 | −2 |
| 1 | 0 | 1 | $X_{12}(t)$ | 2 | −2 | 2 |
| 1 | 1 | 0 | $X_{15}(t)$ | 2 | 2 | −2 |
| 1 | 1 | 1 | $X_{14}(t)$ | 2 | 2 | 2 |

FIG. 8b

| | | $C_1$ | $C_2$ | $C_3$ |
|---|---|---|---|---|
| $P_1(t)$ | | −1 | 1 | −3 |
| $P_2(t)$ | | −3 | −1 | −1 |
| $P_3(t)$ | | 1 | +3 | −1 |
| $P_4(t)$ | | −1 | +1 | +1 |
| $P_5(t)$ | | +1 | −1 | −1 |
| $P_6(t)$ | | −1 | −3 | +1 |
| $P_7(t)$ | | +3 | +1 | +1 |
| $P_8(t)$ | | +1 | −1 | +3 |
FIG. 12a
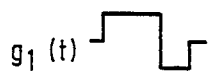
$g_1(t)$
$g_2(t)$     FIG. 12b
$g_3(t)$

METHOD OF TRANSMITTING INFORMATION BY MEANS OF CODE SIGNALS, INFORMATION TRANSMISSION SYSTEM FOR CARRYING OUT THE METHOD, AND TRANSMITTING AND RECEIVING APPARATUS FOR USE IN THE TRANSMISSION SYSTEM

BACKGROUND OF THE INVENTION

1. Field of the Invention

The invention relates to a method of transmitting n-bit information words by means of code signals. The invention also relates to an information transmission system for carrying our the method, comprising a transmitting apparatus for converting n-bit information words into code signals and for transmitting the code signals via a transmission channel or transmission medium, and a receiving apparatus for reconverting the code signals into n-bit information words.

The invention further relates to a transmitting apparatus and a receiving apparatus for use in the transmission system.

2. Prior Art

Such a method, transmission system, and transmitting and receiving apparatus for the transmission of digitised audio information via an optically readable disc are known inter alia from the Applicant's British Patent Specification No. 2,083,322 (PHQ 80.007). By means of the method described therein information words representing a sampled audio signal are EFM encoded and are transmitted in EFM-encoded form. In this way an audio signal of very high quality is transmitted in a very reliable manner, provided that the bandwidth required for transmission, which is approximately 1.2 MHZ, is adequate. However, if this bandwidth decreases below the said value, and number of detection errors during the reception of the EFM-encoded signal increases very rapidly. For example, in the case of a bandwidth reduction to approximately 80% of the required bandwidth, the number of detection errors becomes so large that information transmission becomes impossible. This abrupt failure of information transfer in the case of bandwidth reduction is inherent in the current methods of transmitting digital information. Another undesired property, which is also inherent in the known methods of transmitting digital information, is the absence of flexibility of the digital format. Once a digital information transmission system has been designed, it is substantially impossible to change the quality of the transmitted information signal in a manner compatible with the predetermined format. Thus, once a standard has been selected for a digital format, it is not possible to profit from subsequent improvements in technology which would enable the quality of the transmitted signal to be improved.

Moreover, with the known digital transmission system it is also impossible to reduce the bandwidth at the expense of a lower quality of information transmission.

SUMMARY OF THE INVENTION

It is an object of the invention to provide means which enable the above-mentioned drawbacks to be mitigated. According to the invention this object is achieved for the method defined of the type setforth, in the opening sentence in that, for different information words, bits having corresponding bit positions are represented by frequency components which are situated mainly within the same frequency range of the frequency spectra of the associated code signals. Bits having different bit positions are represented by frequency components which are situated mainly in different frequency ranges.

As regards the information transmission system this object is achieved in that the transmitting apparatus comprises means for converting information words into code signals in which bits having the same bit positions in different information words are represented by frequency components in the same frequency range within the frequency spectra of the associated code signals and in which bits having different bit positions are represented by frequency components in different frequency ranges within the frequency spectra.

If, in the method and the information transmission system in accordance with the invention, the available bandwidth is smaller than the bandwidth required for transmitting the complete information, transmission is maintained for bits represented by frequency components situated within the available bandwidth.

After transmission the code signals can be reconverted into information words by means of a method which is characterized in that after transmission of the code signals the individual bits of the information words are recovered from the code signals by detection of said frequency components representing the bits.

A further embodiment of the method is characterized in that the detection of said frequency components is carried out by determining the correlation between the received code signals and sub-signals having frequency spectra containing mainly those frequency components which correspond to the frequency components to be detected. Such a detection of the frequency components can be implemented in a very simple manner.

The information words often comprise bits of different significance. In that case it is necessary that the transmission of the most significant bits be maintained when the bandwidth is reduced. An embodiment of the method which meets this requirement is characterized in that bits of a higher significance than other bits are represented by frequency components which are situated in portions of the transmission band which are more reliable than the portions of this band in which the frequency components representing said other bits are situated.

Some types of transmission channels and transmission media, such as for example optically readable record carriers, are mainly suitable for transmitting binary code signals. Transmission channels or transmission media of this type frequently employ code signals comprising sequences of consecutive bit cells of constant length (full-T pulse). An embodiment of the method suitable for information transmission by means of code signals of this type is characterized in that, for transmission, a group of $2^n$ code signals is selected from all the possible code signals, which group meets the requirement that during correlation of the code signals with n different sub-signals, the number of different combinations of signs of the correlation coefficients is equal to $2^n$, the frequency components of the sub-signals being situated in different frequency ranges.

For a reliable transmission it is also desirable that the various bits are transmitted with minimal interaction.

An embodiment of the method which minimizes this interaction is characterized in that sub-signals are formed by n signals of a set of orthogonal signals.

During detection of frequency components representing a specific bit, the frequency components representing the other bits have no or hardly any influence on this detection, because the sub-signals of a set of orthogonal sub-signals are uncorrelated. Particularly suitable sets of orthogonal sub-signals are Walsh functions.

A suitable embodiment of the method is characterized in that the n sub-signals are formed by three Walsh functions of a set of four Walsh functions. In this embodiment the bandwidth required for complete information transmission is found to be only slightly larger (+10%) than the bandwidth required for transmitting the non-encoded information words.

Moreover, it is found that the noise immunity of the transmission is high, in particular for the transmission of the most significant bits, in comparison with conventional digital information transmission systems.

BRIEF DESCRIPTION OF THE DRAWING

Embodiments of the method and the information transmission system in accordance with the invention and further advantages thereof will now be described in more detail, by way of example, with reference to FIGS. 1 to 12, of which FIG. 1 to FIG. 3 illustrate a customary priorart method of transmitting digitized information, FIG. 7 illustrates the relationship between all possible code signals comprising 4 binary bit cells and the correlations C of these code signals with the sub-signals shown in FIG. 6a, FIGS. 8a and 8b illustrate the relationship between information words and code signals for a method in accordance with the invention, FIGS. 11 and 12 shows the code signals, the subsignals and the correlation between these signals for other embodiments of the inventive method.

DETAILED DESCRIPTION OF THE PREFERRED EMBODIMENT

Figure 4A:
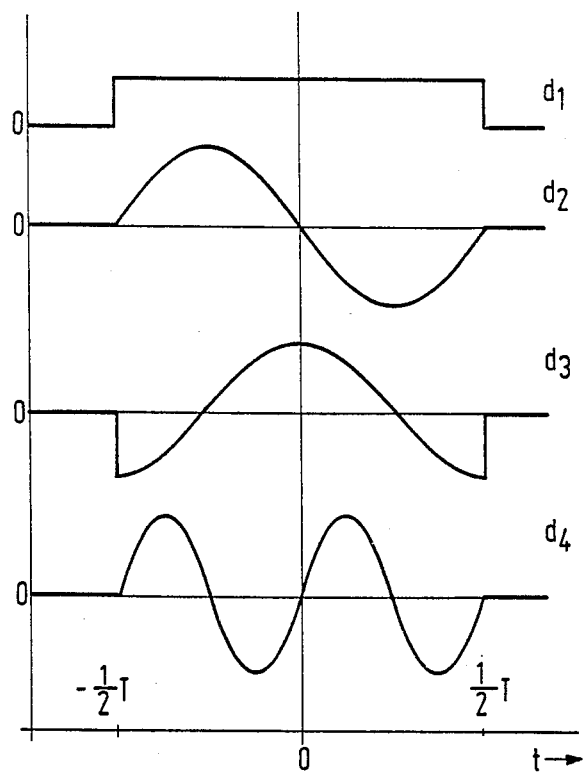
FIG. 4a shows a set of four orthogonal subsignals for use in the inventive method.

FIG. 1 shows an analog signal 1, for example an audio signal, as a function of time t. In a conventional method of digitally transmitting, the signal 1 is sampled at equidistant instants t1, ..., t12. These samples, which are designated $J_1 \ldots, J_{12}$ in FIG. 1, are subsequently converted into a sequence of digital codes. FIG. 2 shows an example of a sequence of such digital codes. The codes, hereinafter referred to as information words, bear the reference numeral 2. Each information word 2 comprises a plurality of consecutive bits $b_0, \ldots, b_7$ of decreasing significance. The extent to which each bit contributes to the numerical value represented by the information word 2 then depends on the bit position within the information word 2

$$\left(\text{numerical value} = \sum_{i=0}^{7} b_i \cdot 2^{-1}\right).$$

The bit $b_0$ providing the largest contribution to the numerical value is generally referred to as the most significant bit (MSB) and the bit $b_7$ providing the smallest contribution is generally referred to as the least significant bit (LSB).

FIG. 3 illustrates the customary method of transmitting these information words. By means of an encoding device 3, the information words 2 are converted into code words 4 having a larger number of bits, which code words are better suitable for transmission than the information words 2. The code words 4 are converted into code signals 5 comprising a sequence of consecutive binary bit cells 7 of constant length. The code signals 5 are transmitted via a band-limited transmission channel 8 or transmission medium, for example in the form of an optically readable record carrier or a magnetic tape. As a result of the limited bandwidth the code signal 5 is transmitted in distored form. In FIG. 3 this distorted code signal bears the reference numeral 9. The code words 4 are recovered from the distorted code signals 9 by sampling the code signal 9 at equidistant instants corresponding to the centres of the bit cells and by subsequently deriving the consecutive bits of the code words 4 from the signs of the samples. By means of a decoding circuit 10 the code word 4 is reconverted into the information word 2, after which transmission is completed. (For a comprehensive description of such an information transmission reference is made to the book "Principles of pusle code modulation", K. W. Cattermale, LONDON ILIFFE BOOK LTD.).

The transmission system shown in FIG. 3 performs satisfactorily as long as the bandwidth of the transmission channel 8 or the transmission medium is adequate. In the case of a bandwidth, slightly below this required bandwidth it becomes impossible to recover the information words from the distorted code signal 9. In accordance with the invention, this drawback is mitigated by selecting for the transmission a class of code signals for which the information word bits having different bit positions are represented by frequency components of the code signals in different frequency ranges, namely in such a way that each bit having the same bit position is represented in each of the code signals in the same frequency range. By selecting the relationship between the information words in such a way that the most significant bits are represented by frequency components situated in the most reliable portion of the band of the transmission channel, the transmission of the moot significant bits can be maintained in the event of a bandwidth reduction.

A class of suitable code signals will now be described with reference to FIGS. 4a and 4b.

Figure 4B:
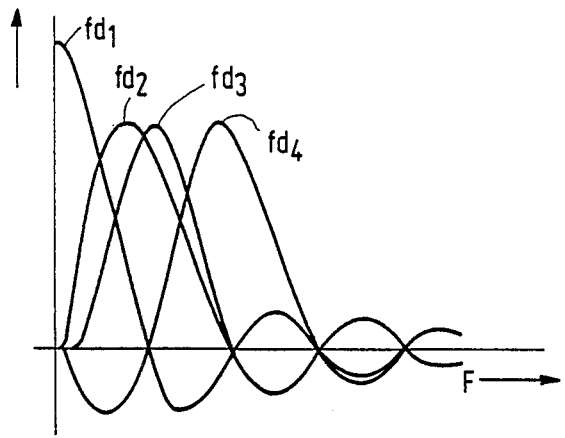
FIG. 4b represents the absolute values of the Fourier transforms of the sub-signals shown in FIG. 4a, FIG. 5 shows an embodiment of an information transmission system in accordance with the invention.

FIG. 4a shows a set of signals $d_1$, $d_2$, $d_3$ and $d_4$ as a function of time t. Outside the time interval $-\frac{1}{2}T$ to $\frac{1}{2}T$ the signal values for all the signals $d_1$, $d_2$, $d_3$, $d_4$ are zero. Further, the signals are selected in such a way that the integral $$Iij = \int_{-\frac{1}{2}T}^{\frac{1}{2}T} d_i \cdot d_j \cdot dt$$

is zero for $i \neq j$ and is equal to a constant c for $i=j$. A set of signals meeting the above requirement is known as a set of orthogonal signals. Moreover, the signals are selected in such a way that their frequency spectra are situated in different frequency ranges. The absolute values of the Fourier transforms of the sub-signals $d_1$, $d_2$, $d_3$ and $d_4$ are given in FIG. 4b as a function of the frequency F and bear the references fd1, fd2, fd3 and fd4 respectively. For the transmission of 4-bit information use is made of code signals comprising a linear combination $$\sum_{i=1}^{4} a_i \cdot d_i$$

of the sub-signals $d_1$, $d_2$, $d_3$, $d_4$. In this combination $a_i$ always represents the logic value of the $i^{th}$ bit $b_i$ and the information word: for example $a_i = 1$ indicates that the $i^{th}$ bit has the logic value 1 and $a_i = -1$ indicates that the $i^{th}$ bit has the logic value 0. Another possibility is that $a_i \neq 0$ indicates a bit of the logic value 1 and $a_i = 0$ a bit of the logic value 0. Thus, for each possible information word a code signal is obtained in which the various bits are represented by different portions of the frequency spectrum.

After transmission of the code signals, correlation of the transmitted code signal Sc with the sub-signals $d_1$, $d_2$, $d_3$ and $d_4$ simply enables the individual bits $b_i$ of the information words to be derived from the received code signals in conformity with the following relationship:

$$\int_{-\frac{1}{2}T}^{+\frac{1}{2}T} Sc \cdot d_i \cdot dt = \int_{-\frac{1}{2}T}^{+\frac{1}{2}T} d_i \cdot \sum_{j=1}^{4} a_j \cdot d_j \cdot dt = \quad (1)$$

$$a_i \int_{-\frac{1}{2}T}^{+\frac{1}{2}T} d_i^2 \cdot dt$$

from which it follows that $$b_i = \text{sign} \int_{-\frac{1}{2}T}^{+\frac{1}{2}T} Sc \cdot d_i dt$$

It is to be noted that on account of the orthogonality of the sub-signals $d_i$ all the contributions of $a_j \cdot d_j \cdot d_i$ are zero for $1 \neq j$, so that the interaction between the different bits during detection is minimal. It is obvious that the logic values of the bits can also be determined simply by means of discrete-time correlation signals, for example in conformity with relationship 2.

$$b_i = \text{sign} \sum_{k=1}^{4} Sc(k) d_i(k) \quad (2)$$

Herein, Sc (k) and $d_i(k)$ are the function values of Sc and di at the instants $t = \frac{3}{8}T$, $-\frac{1}{8}T$, $\frac{1}{8}T$, $\frac{3}{8}T$ for $k = 1, 2, 3$ and 4 respectively.

If in the manner described in the foregoing 4-bit information words are transmitted via a transmission channel with a low reliability of the high-frequency portion of the transmission band in which mainly the frequency components fd4 (see FIG. 4b) are situated, the tranmission of the bit represented by the frequency components in this frequency range are also unreliable.

However, the reliability of the transmission of the other bits is affected to a much smaller extent because these bits are represented by frequency components which are situated mainly outside the unreliable range.

It will be evident that for a most reliable information transmission the relationship between the code signals and the information words must be selected in such a way that the least significant bit is represented by the components fd4 in the highest frequency range, whilst the most significant bit is represented by frequency components fd1 of the lowest frequency range.

FIG. 5 shows an embodiment of a transmission system in accordance with the invention by means of which 4-bit information words can be transmitted in a manner as described in the foregoing. The transmission system comprises a transmitting apparatus 33 for converting 4-bit information words applied via a bus 21 into a code sigals Sc. The code signals Sc appear on an output 34 of the transmitting apparatus 33. The reference numeral 20 denotes a 4-bit register for receivng 4-bit information words via the input bus 21. The process of loading the register 20 is controlled in a customary manner by means of a clock signal C1 which is generated by a clock generator 22 and which is applied to the clock input of the register 20. The clock generator 22 generates a second clock signal C12 for controlling a function generator 23 which in synchronism with the clock signal C1 generates the sub-signals $d_1$, $d_2$, $d_3$ and $d_4$ on four outputs. The signal $d_1$ is applied to the inverter circuit 24 and an analog multiplexer 25. The signal $d_2$ is applied to an inverter circuit 26 and an analog multiplexer 27. The signal $d_3$ is applied to an inverter circuit 28 and an analog multiplexer 29. Finally, the signal $d_4$ is applied to an inverter circuit 30 and an analog multiplexer 31. The control inputs of the multiplexer 25, 27, 29 and 31 are connected to the resepctive outputs of the register 20, which supply logic signals which respectively represent the bits $b_1$, $b_2$, $b_3$ and $b_4$ of the information word stored in the register 20. The outputs of the analog multiplexers 25, 27, 29 and 31 are connected to a summing circuit 32. Thus, on the output of the summing circuit 32 a code signal is generated, which comprises a linear combination of the sub-signals $d_1$, $d_2$, $d_3$ and $d_4$, a contribution of each sub-signal $d_1$, $d_2$, $d_3$ and $d_4$ to the code signal being determined by the logic values of the bits $b_1, \ldots b_4$ of the information word stored in the register 20. The output of the summing circuit 32 functions as the output 34 of the transmitting apparatus 33. The code signals Sc are applied to a receiving apparatus 46 via a transmission channel or transmission medium 35. The receiving apparatus 46 is constructed as a correlator for determining the signs of the correlation between the code signals and sub-signals in conformity with relationship 2. For this purpose the receiving apparatus comprises an input circuit 36 for sampling the received code signals with a frequency equal to 4 times the repetition rate of the code signals Sc in response to the clock pulse C14 generated at the instants $-\frac{3}{8}T$, $-\frac{1}{8}T$, $\frac{1}{8}T$, $/8T$ within the duration $(-\frac{1}{2}T$ to $\frac{1}{2}T)$ of the code signals Sc. The clock pulses C14 can be derived from the code signals by a clock regenerator 40 using technologies known per se. The input circuit 36 further comprises an analog/ digital converter for converting the samples into a digital signal, which is subsequently delayed by time intervals $\frac{1}{4}T$, 2/4T and $\frac{3}{4}T$ by three clocked parallelin/parallel-out registers 37, 38 and 39 respectively. The outputs of the input circuit 36 and the registers 37, 38 and 39 will be referred to hereinafter as $U_k$, $U_{k+1}$, $U_{k+2}$ and $U_{k+3}$.

The clock regenerator 40 also derives clock pulses C15 from the code signals Sc, which clock pulses indicate the transitions between consecutive code signals.

A computing circuit 41 determines the sign of the sum of the signals $U_k$, $U_{k+1}$, $U_{k+2}$, $U_{k+3}$. A logic signal representing this sign is applied to an input b1* of a 4-bit register 42.

A computing circuit 43 determines the sign of $(U_k-U_{k+1}+U_{k+2}+U_{k+3})$. A logic signal representing the result of this computation is applied to an input b2* of the register 42.

A computing circuit 44 determines the sign of $(U_k+U_{k+1}+U_{k+2}-U_{k+3})$ and a logic signal representing the result of this computation is applied to an input b3* of the register 42.

A computing circuit 45 determines the sign of $(U_k+U_{k+1}-U_{k+2}+U_{k+3})$ and a logic signal representing the result of this computation is applied to an input b4* of the register 42. The signals on the inputs b1* ... b4* of the register 42 are loaded into the register 42 in response to the clock pulses C15 applied to the clock input of the register 42.

The clock pulses C15 coincide with the transitions between the consecutive code signals Sc, so that at the instant of loading the register 42 the signals on the inputs b1*, b2*, b3* and b4* represent the signs of the correlation between the received code signal Sc and the sub-signals $d_1$, $d_2$, $d_3$ and $d_4$ in conformity with relationship (2). These signs correspond to the logic values of the bits $b_1, \ldots, b_4$ of the information word represented by the transmitted code signal, so that in response to the clock pulse C15 the register 42 is always loaded with the information word transmitted by means of the code signal.

Another embodiment of the inventive method where the code signals comprise binary bit cells of constant length will be described hereinafter with reference to FIGS. 6, 7 and 8.

Figure 6A:
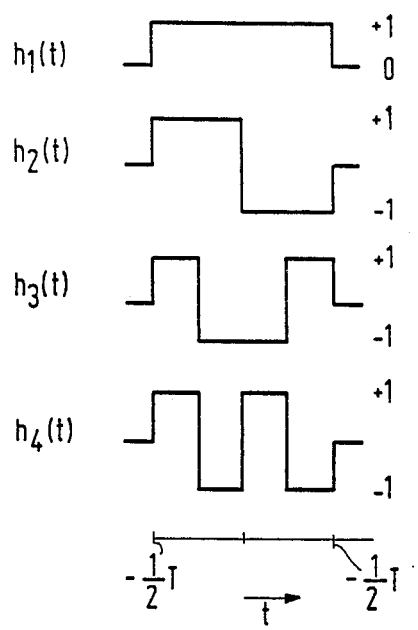
FIG. 6a shows a set of orthogonal Walsh functions for use in the inventive method.

FIG. 6a shows a set of four orthogonal sub-signals $h_1(t)$, $h_2(t)$, $h_3(t)$, $h_4(t)$, each comprising four biary bit cells of equal length. Such a set of orthogonal functions is known as a set of Walsh functions.

Figure 6B:
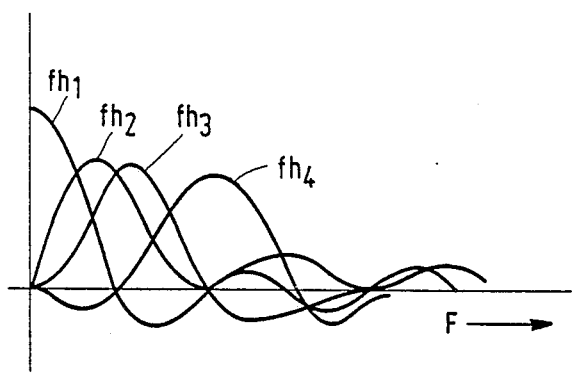
FIG. 6b represents the absolute values of the Fourier transforms of the sub-signals shown in FIGS. 6b.

FIG. 6b gives the absolute values of the Fourier transform of the functions $h_1, \ldots, h_4$, as a function of the frequency F which values are represented by fh1, fh2, fh3 and fh4. As is apparent from FIG. 6b, the different functions $h_1, \ldots, h_4$ mainly comprise frequency components in different frequency ranges.

In FIG. 7 the signals $x_1, \ldots, x_{16}$ denote all the signals which can be formed by four binary bit cells of constant length. Further, in the columns C1, C2, C3 and C4, FIG. 7 gives the correlations between the signals $x_i$ and the signals $h_1$, $h_2$, $h_4$ respectively.

From the signals $x_i$ shown in FIG. 7 eight signals can be selected which meet the requirement that the signs of three of the correlations exhibit eight different combinations. FIG. 8a shows eight signals $x_i$ for which the signs of C2, C3 and C4 exhibit eight different combinations. In FIG. 8b eight signals $x_i$ are given for which the signs of C1, C2 and C3 exhibit eight different combinations.

Further, FIGS. 8a and 8b illustrate the relationship between 3-bit information words in column S and the signals $x_i$.

In FIG. 8a the bit $b_1$ of the information word is always represented by the same frequency components in the frequency spectra of the signals $x_i$, namely the frequency components which correspond to the frequency spectrum of the signal $h_2$ or frequency components which correspond to the frequency spectrum of the inverted signal $h_2$. Similarly, the bits $b_2$ and $b_3$ are represented by frequency components corresponding to the frequency spectrum of $h_3$ of $-h_3$ and $h_4$ or $-h_4$.

In the relationship between the information words in column S and the signals $x_i$ as given in FIG. 8b the various bits $b_1$, $b_2$ and $b_3$ are represented by frequency components corresponding to the frequency spectra of $h_1$ or $-h_1$, $h_2$ or $-h_2$, and $h_3$ or $-h_3$.

By means of correlation techniques the individual bits $b_1$, $b_2$ and $b_3$ of the information words can be derived from the transmitted code signals. For the relationship between S and $x_i$ illustrated in FIG. 8b this may be effected, for example, as follows $$b_1 = \operatorname{sign} \sum_{k=1}^{4} x_i(k) \cdot h_i(k) \qquad (3)$$

where $x_i(k)$ and $h_1(k)$ are the function values of $x_i$ and $h_1$ at the instants $-\frac{3}{8}T$, $-\frac{1}{8}T$, $\frac{1}{8}T$, $\frac{3}{8}T$.

It is evident that more than four function values of $x_i$ and $h_1$ may be used for determining the sign of the correlation. For example, it is alternatively possible to use the function values of $x_i$ and $h_1$ at instants $-7/16T$, $-5/16T$, $-3/16T$, $-1/16T$, $1/16T$, $3/16T$, $5/16T$ and $7/16T$ for determining the correlation.

Figure 9:
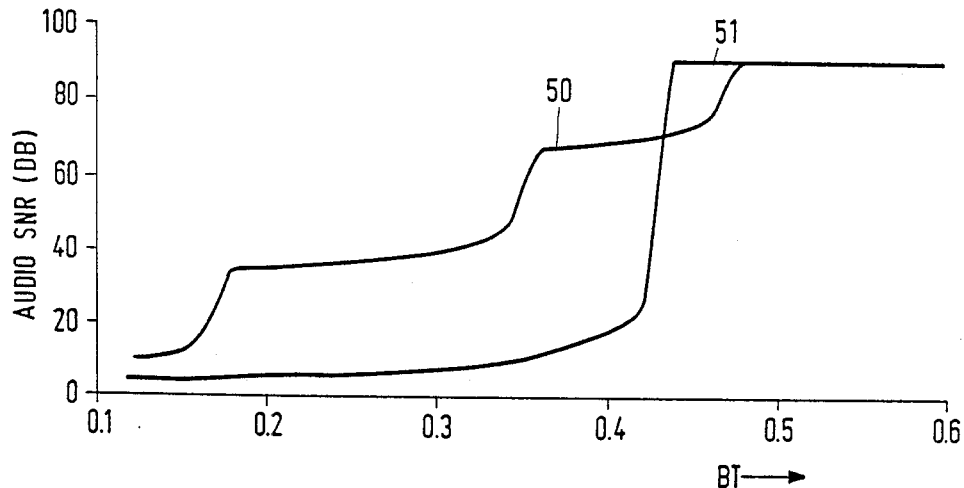
FIG. 9 illustrates the signal-to-noise ratio of a digitized PCM-encoded audio signal as a function of the available bandwidth.

FIG. 9 illustrates the influence of the bandwidth on the signal-to-noise ratio of the PCM-encoded signal in the case that by means of the inventive method 15-bit linearly quantised samples of, for example, an audio signal are transmitted, all the noise being constituted by quantisation noise, and the fifteen bits of the linearly quantised samples being divided among five three-bit information words. The first five most significant bits of the samples are represented by the msot significant bits of the five 3-bit information words. The five least significant bits of the samples are represented by the least significant bits of the five 3-bit information words. The other five bits of the samples are represented by the other bits of the five 3-bit information words. The code signals are the code signals $x_i$ given in FIG. 8b, the bits $b_1$ being the most significant bits and the bits $b_3$ being the least significant bits.

In FIG. 9 the curve 50 illustrates the signal-to-noise ratio (SNR) obtained with the transmission method described in the foregoing. This signal-to-noise ratio decreases gradually as the relative bandwidth BT decreaes.

For comparison the Figure also gives the signalto-noise ratio if the 15-bit linearly quantised samples are transmitted by a conventional transmission system, using code signals which for each sample comprises a sequence of fifteen binary bit cells of constant length. The signal-to-noise ratio of the PCM encoded signal of the conventional transmission system bears the reference numeral 51.

Comparing the signal-to-noise ratios in the two systems reveals that with the conventional system the information transmission ceases abruptly if the bandwidth becomes smaller than a specific threshold value, whilst with the information transmission in accordancre with the invention the quality of the information transmission deteriorates only gradually as the bandwidth decreases.

When the last-mentioned method of information transmission is used the number of reliable bits for each sample decreases as the available bandwidths decreases. Another method of transmitting digital audio signals which can be carried out by means of the inventive method and in which the quality of the transmitted audio signal also deteriorates as the bandwidth decreases can be obtained, for example, by dividing the number of samples into groups of 3. All bits of a first sample of the group are then represented by the most significant bits of fifteen consecutive information words. The bits of a second sample of such a group are represented by the bits $b_2$ of fifteen consecutive 3-bit information words. The bits of a third sample of the group are then represented by the least significant bits $b_3$ of the fifteen consecutive information words. With such an information transmission method the quality of the transmission will deteriorate as the bandwidth decreases in that the number of reliable samples decreases.

Another advantage of the information transmission in accordance with the invention is that the number of detection errors as a result of additional noise for bits represented by frequency components in the most reliable portion of the frequency band of the transmission system is substantially smaller than for bits represented by frequency components in less reliable portions.

For the code signals given in FIG. 8b the Table 1 gives the detection-error probability P that a bit is detected incorrectly in a transmission system for a transmission channel having a low-pass characteristic in the event that the information transmission is disturbed by white noise.

TABLE 1

| transmission in accordance with the invention | | conventional transmission | |
|---|---|---|---|
| bit | error probability | bit | error probability |
| $b_2$ | $10^{-3} \cdot a^p$ | $b_1$ | $26 \cdot 10^{-3} a^p$ |
| $b_1$ | $6 \cdot 10^{-3} \cdot a$ | $b_1$ | $26 \cdot 10^{-3} a$ |
| $b_3$ | $26 \cdot 10^{-3} \cdot a$ | $b_3$ | $26 \cdot 10^{-3} a$ |
| | | $b_4$ | $26 \cdot 10^{-3} a$ |

For comparison, the table also gives the error probability if by means of conventional transmission techniques code signals for four bit cells are transmitted, which each represent a 4-bit information word. Similar effects occur also if a transmission channel having a highpass characteristic is employed. However, in that case the detection of bits represented by components of the highest frequency are more immune to noise.

Figure 10:
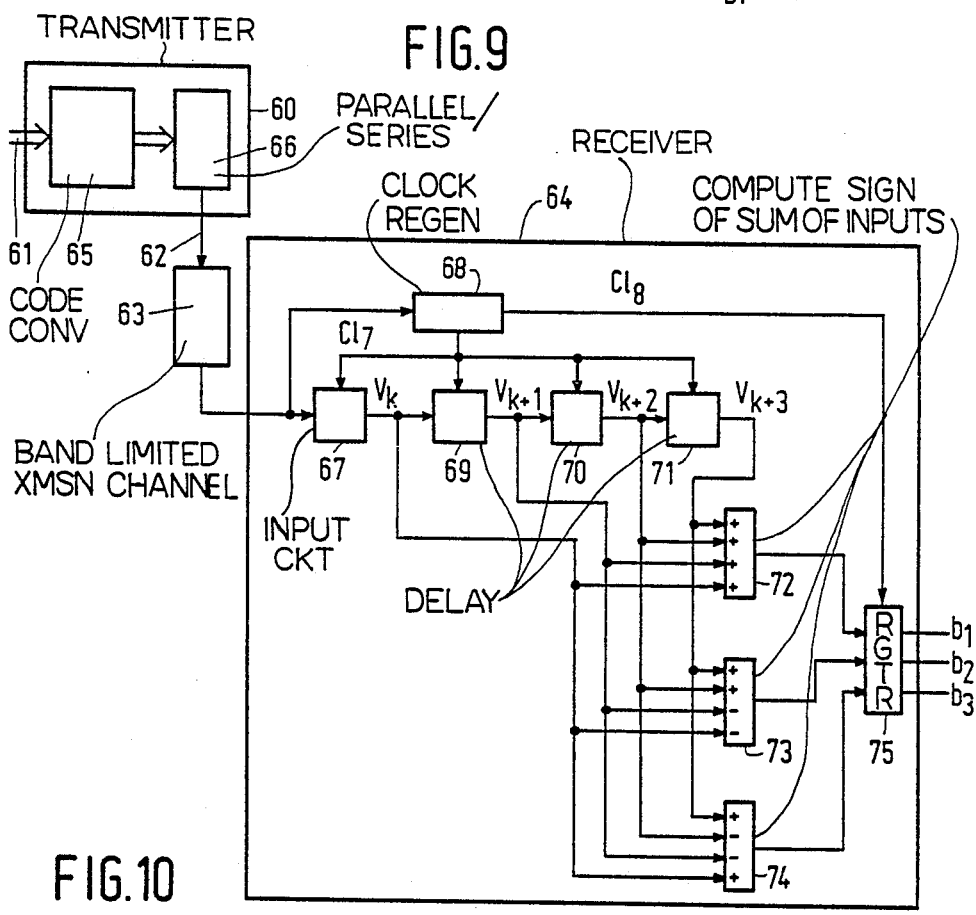
FIG. 10 shows an embodiment of an information transmission system in accordance with the invention, using code signals comprising binary bit cells of constant length.

An embodiment of an information transmission system in accordance with the invention for carrying out the information transmission by means of code signals comprising sequences of binary bit cells of constant length is given in FIG. 10.

The transmission system shown comprises a transmitting apparatus 60, which converts 3-bit information words applied to an input bus 61 into code signals comprising four binary bit cells and subsequently supplies these code signals to a band-limited transmission channel 63 via an output 62. Via the transmission channel 63 the code signals are applied to a receiving apparatus 64 which reconverts the code signals into 3-bit information words. The transmitting apparatus 60 comprises a code converter 65 which converts the 3-bit information words into 4-bit code words in conformity with the following Table 2.

TABLE 2

| information words | code words |
|---|---|
| 000 | 0010 |
| 001 | 0001 |
| 010 | 0100 |
| 011 | 1000 |
| 100 | 0111 |
| 101 | 1011 |
| 110 | 1110 |
| 111 | 1101 |

Such a code converter 65 may comprise, for example, a memory in which the above Table 2 is stored. The 4-bit code words at the output of the code converter 65 are applied to a parallel-serial converter 66 which converts the code words into code signals in the form of serial data sequences comprising binary bit cells of equal length, the bit cell values being situated symmetrically relative to the zero level (NRZ signals). The relationship between the 3-bit information words and the code signals thus obtained corresponds to the relationship illustrated in FIG. 8b. The code signals at the output of the converter 66 are transmitted to the receiving apparatus 64 via the output 62 and the transmission channel 63. The receiving apparatus 64 regenerates the bits of the transmitted information word in conformity with relationship (3) by each time determining the correlation between the received code signals and the sub-signals $h_1$, $h_2$ and $h_3$ respectively, as is illustrated in FIG. 6a. For this purpose the receiving apparatus comprises an input circuit 67 which samples the received code signals and converts them into a digital representation. The samples are controlled by means of clock pulses C17 which are in phase with the centres of the bit cells of the code signals. The clock pulses C17 are derived from the received code signals by means of a clock regenerator 68, for example using customary phase-locked loop techniques. The digital representations of the samples are delayed by $-\frac{1}{4}T$, $\frac{1}{2}T$ and $\frac{3}{4}T$ by means of delay circuits 69, 70 and 71 respectively controlled by clock pulses C1$_7$, for example clocked parallel-in/parallelout registers. The digital representations at the outputs of the input circuit 67 and the delay circuits 69, 70 and 71 are referred hereinafter as $V_k$, $V_{k+1}$, $V_{k+2}$ and $V_{k+3}$ respectively.

By means of computing circuits 72, 73 and 74 and an output register 75 the bits $b_1$, $b_2$ and $b_3$ of the information word are recovered from the values of $V_k$, $V_{k+1}$, $V_{k+2}$ and $V_{k+3}$ respectively.

The values V, $V_{k+1}$, $V_{k+2}$ and $V_{k+3}$ represent the signal values at the centres of four consecutive bit cells. If these four consecutive bit cells belong to the same code signal the signal on the output of the computing circuit 72, which determines the sign of $(V_k+V_{k+2}+V_{k+2}+V_{k+3})$, indicates the sign of the correlation between the received code signal and the signal $h_1$ and hence the logic value of the bit $b_1$ of the information word. Similarly, the output of the computing circuit 73, determining the sign of $(V_k-V_{k+1}+V_{k-2}+V_{k-3})$, indicates the logic value of the bit $b_2$, and the output of the computing circuit 74, which determines the sign of $(V_k-V_{k+1}-V_{k2}+V_{k+3})$, indicates the logic value of the bit $b_3$.

In response to clock pulses C1$_8$ which are in phase with the transitions between consecutive code signals the output signals of the computing circuits 72, 73, and 74 are loaded into the register 57, so that the 3-bit information words transmitted by means of the code signals are supplied to the outputs of the register 75. The clock pulses C18 are also derived from the input signal of the receiving apparatus 64 by means of the clock regenerator 68 in a customary manner.

The information systems described with reference to FIGS. 6 to 10 employ code signals comprising sequences of four binary bit cells. When the information words are recovered from the transmitted code signals the sign of the correlation between the transmitted code signal and one signal of the set of four Walsh functions is determined each time. It is evident that similar information can be obtained by means of code signals comprising $4^l$ bit cells. Such code signals can be formed by linear combinations of Walsh functions of a set of $4^l$ orthogonal Walsh functions.

From all possible code signals which can be formed from $4^l$ bit cells those code signals must then be selected for transmission which in the case of correlations with $2^n$ Walsh functions of the set of $4^l$ orthogonal Walsh functions yield $2^n$ different combinations of signs of the correlations. In that case n different bits can always be detected unambiguously by correlation with the Walsh functions.

Figure 11A:
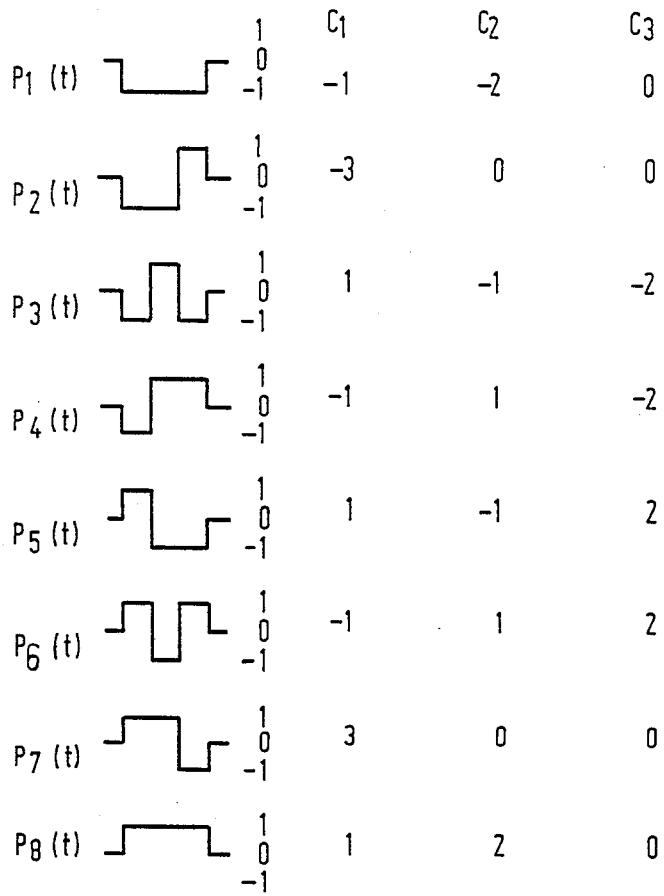
Figure 11B:
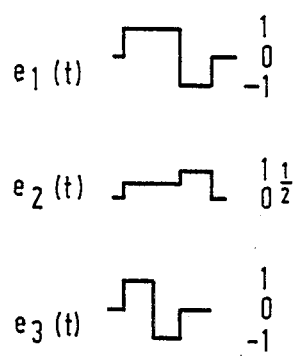

It is to be noted that alternatively sets of orthogonal functions other than Walsh functions may be used for detection. For example, in FIG. 11a four different 3-bit code signals $p_3(t)$, $p_4(t)$, $p_5(t)$, $p_6(t)$ are given by means of which 2-bit information words can be transmitted, which are recovered after transmission by determining the signs of the correlations C2 and C3 of the received code signals with two signals $e_2(t)$ and $e_3(t)$ of a set of 3 orthogonal functions $e_1(t)$, $e_2(t)$ and $e_3(t)$ (FIG. 11b).

It will be evident that the frequency spectrum of the signal $e_2(t)$ mainly exhibits frequency components in the low frequency range, whilst the frequency spectrum of the signal $e_3(t)$ exhibits more frequency components in the high frequency range.

In all the information transmission systems described in the foregoing the individual bits are recovered from the transmitted code signal by correlation of the code signals with sub-signals of a set of orthogonal sub-signals. This has the advantage that the sub-signals are non-correlated, so that there is no interaction between the detections of different bits. However, it is to be noted that it is not essential to use sub-signals of a set of orthogonal sub-signals for detection. For example, FIG. 12b gives a set of three non-orthogonal functions with frequency components in different ranges of the frequency spectrum, which open correlation with the eight possible different code signals comprising three bit cells yield eight different combinations of signs of the correlations C1, C2 and C3.

Neither is it necessary that the frequency components in the code signals representing the different bits are detected by means of correlation techniques. It will be obvious that such a detection can also be carried out by determining the frequency spectrum of the code signal and analysing the resulting frequency spectrum.

Further, it will be obvious to those skilled in the art that various code signals may be used. It is essential only that bits having corresponding bit positions are always represented by frequency components in the same frequency range and that the bits having different bit positions are represented by frequency components in different frequency ranges. In that case the relationship between the information words and the code signals can always be selected in such a way that the quality of the transmission degrades only gradually when the bandwidth is reduced.

What is claimed is:

1. A method for transmitting n-bit information words, where n is a positive integer, comprising the step of:
representing the information words by m-bit code signals having a frequency spectrum, where m is an integer greater than or equal to n, the code signals being such that frequency components of the frequency spectrum represent bit positions, so that:
  ii. corresponding bit positions in different information words are represented in code words by frequency components situated mainly within a same range of the frequency spectrum; and
  iii. bits having different bit positions have frequency components situated mainly within different ranges of the frequency spectrum;
the representing step comprising selecting the code signals from a group of $2^n$ code signals, the group of $2^n$ code signals being a subset of the $2^m$ possible code signals, the subset being such that upon decoding the code signals are correlatable, with n sub-signals having respective frequency spectra containing mainly respective distinct frequency components which correspond to respective ones of said frequency components which represent the bits of the code signals, to produce $2^n$ combinations of correlation coefficients, the combinations being distinguishable by the signs of the correlation coefficients.

2. The method of claim 1 comprising the further step of:
recovering the information words from received code signals after transmission, the recovering step including the step of detecting said frequency components which represent the bits of the code signals.

3. The method of claim 2 wherein the detecting step comprises determining the correlation between the received code signals and the sub-signals.

4. The method of claim 1 comprising the further step of:
transmitting the code signals via a transmission channel or medium having a transmission band comprising a plurality of portions, one of the portions being more reliable than the others; and
wherein the representing step further comprises selecting the code words, by means of the code signals, so that bits of the information words having higher significance correspond to frequency components which are mainly situated in the at least one portion and the remaining bits correspond to frequency components which are mainly situated in the other portions.

5. The method of claim 1 wherein the representing step further comprises selecting the code signals to be correlatable with n orthogonal sub-signals.

6. The method of claim 5 wherein the representing step further comprises selecting the code signals so that:
a. m is an integral power of four ($4^l$, where l is an integer); and
b. the code signals are correlatable with n Walsh functions chosen from a set of m Walsh functions.

7. The method of claim 6 wherein the representing step further comprises representing the 3-bit information words by 4-bit codes signals.

8. An information transmission system for transmitting n-bit information words, where n is a positive integer, comprising:
a. transmitting apparatus for transmitting code signals having a frequency spectrum via a transmission channel or medium, the transmitting apparatus comprising means for converting n-bit information words into m-bit code signals, where m is an integer greater than or equal to n, the code signals being:
 i. such that frequency components of the frequency spectrum represent bit positions, so that:
  a. corresponding bit positions in different information words are represented in code words by frequency components situated mainly within a same range of the frequency spectrum; and
  b. bits having different bit positions have frequency components situated mainly within different ranges of the frequency spectrum; and
 ii. selected from a group of $2^n$ code signals, the group of $2^n$ code signals being a subset of the possible code signals, the subset being such that upon decoding the code signals are correlatable, with n sub-signals having respective frequency spectra containing mainly respective distinct frequency components which correspond to respective ones of said frequency components which represent the bits of the code signals, to produce $2^n$ combinations of correlation coefficients, the combinations being distinguishable by the signs of the correlation coefficients; and
b. receiving apparatus for reconverting the m-bit code signals into the n-bit information words.

9. The system of claim 8 wherein the receiving apparatus comprises:
a. means for detecting said frequency components in the code signals to produce detection results; and
b. means for deriving the information words from the detection results.

10. The system of claim 9 wherein the detecting means comprises means for correlating the code signals with the n sub-signals to produce the combinations of correlation coefficients.

11. The system of claim 10 wherein the receiving apparatus further comprises:
a. means for determining a first or second logic value of each bit of the information word according to the sign of the correlation between received code signals and a respective one of the n sub-signals; and
b. means for deriving the information words from the logic value of each bit.

12. The system of claim 8, 9, 10 or 11 wherein
a. the channel or medium has a frequency band with a plurality of portions, at least one of the portions being more reliable than the other portions; and
b. the transmitting apparatus generates the code signals so that bits of the information words having a higher significance correspond to the frequency components which are mainly situated in the one portion and the remaining bits are correspond to frequency components which are mainly situated in the other portions.

13. Apparatus for transmitting n-bit information words, where n is a positive integer, in the form of code signals, having a frequency spectrum, via a transmission channel or medium, the apparatus comprising:
a. an input for receiving the n-bit information words;
b. means for converting the n-bit information words into m-bit code signals, where m is an integer greater than or equal to n, the code signals being:
 i. such that frequency components of the frequency spectrum represent bit positions, so that:
  a. corresponding bit positions in different information words are represented in code words by frequency components situated mainly within a same range of the frequency spectrum; and
  b. bits having different bit positions have frequency components situated mainly within different ranges of the frequency spectrum; and
 ii. selected from a group of $2^n$ code signals, the group of $2^n$ code signals being a subset of the possible code signals, the subset being such that upon decoding the code signals are correlatable, with n sub-signals having respective frequency spectra containing mainly respective distinct frequency components which correspond to respective ones of said frequency components that represent the bits of the code signals, to produce $2^n$ combinations of correlation coefficients, the combinations being distinguishable by the signs of the correlation coefficients; and
c. an output coupled with the channel or medium at which the code signals are provided.

14. Apparatus for receiving and decoding code signals, having a frequency spectrum, to form information words, comprising:
a. an input for receiving the code signals from an transmission channel or medium;
b. means for converting n-bit code signals into m-bit information words, where m and n are positive integers and m is greater than or equal to n, the code signals:
 i. being such that frequency components of the frequency spectrum represent bit positions, so that:
  a. corresponding bit positions in different information words are represented in code words by frequency components situated mainly within a same range of the frequency spectrum; and
  b. bits having different bit positions have frequency components situated mainly within different ranges of the frequency spectrum; and
 ii. forming a group of $2^n$ code signals, that is a subset of $2^m$ possible code signals, the subset being such that upon decoding the code signals are correlatable, with n sub-signals having respective frequency spectra containing mainly respective distinct frequency components which correspond to respective ones of said frequency components which represent the bits of the code signals, to produce $2^n$ combinations of correlation coefficients, the combinations being distinguishable by the signs of the correlation coefficients; and
c. an output at which the information words are provided.

* * * * *